United States Patent
Kondo et al.

(10) Patent No.: US 6,228,669 B1
(45) Date of Patent: May 8, 2001

(54) PLANAR MOUNT LED ELEMENT AND METHOD FOR MANUFACTURING THE SAME

(75) Inventors: Hideo Kondo, Atsugi; Hiromoto Tamura, Hachioji, both of (JP)

(73) Assignee: Stanley Electric Co., Ltd. (JP)

( * ) Notice: Subject to any disclaimer, the term of this patent is extended or adjusted under 35 U.S.C. 154(b) by 0 days.

(21) Appl. No.: 09/324,611

(22) Filed: Jun. 2, 1999

(30) Foreign Application Priority Data

Jun. 4, 1998 (JP) ................................. 10-155978

(51) Int. Cl.$^7$ ................................. H01L 21/385
(52) U.S. Cl. ..................... 438/22; 438/558; 438/795
(58) Field of Search ..................... 438/22, 28, 34, 438/38, 45, 46, 542, 548, 558, 559, 795, 796, 798

(56) References Cited

U.S. PATENT DOCUMENTS

| | | | |
|---|---|---|---|
| 4,980,313 | * | 12/1990 | Takahashi ................. 438/45 |
| 5,047,366 | * | 9/1991 | Murakami ................. 438/45 |
| 5,116,781 | * | 5/1992 | Agostinelli et al. ........ 438/559 |
| 5,126,281 | * | 6/1992 | Carey et al. .............. 438/796 |
| 5,126,284 | * | 6/1992 | Curran ..................... 438/22 |
| 5,222,370 | * | 6/1993 | Takahashi ................. 438/45 |
| 5,394,425 | * | 2/1995 | Fukunaga et al. .......... 438/45 |
| 5,506,186 | * | 4/1996 | Van Gurp .................. 438/569 |
| 5,700,714 | * | 12/1997 | Ogihara et al. ............ 438/559 |
| 5,804,461 | * | 9/1998 | Beyea et al. .............. 438/45 |
| 5,856,208 | * | 1/1999 | Sato et al. ............... 438/45 |
| 6,063,646 | * | 3/2000 | Ogihara et al. ............ 438/38 |
| 6,133,125 | * | 10/2000 | Seiler et al. ............. 438/509 |
| 6,136,627 | * | 10/2000 | Ogihara et al. ............ 438/569 |

\* cited by examiner

Primary Examiner—Savitri Mulpuri
(74) Attorney, Agent, or Firm—Ostrolenk, Faber, Gerb & Soffen, LLP

(57) ABSTRACT

A planar mount LED element having at least a pair of P electrode and N electrode formed on one and the same surface of an LED substrate, and a method for manufacturing the same. A P type metal film(s) is formed at a predetermined portion on one surface of an N type LED substrate at a portion where a PN junction is to be formed on the surface of the N type LED substrate. An N type metal film is formed at a predetermined portion on the same surface of the N type LED substrate at a portion where an N electrode is to be formed on the surface of the N type LED substrate. Then the two films are covered with an insulation film to form a capped construction. Thereafter the portion where the PN junction is to be provided is subjected to heat treatment at the diffusing temperature, thereby forming the PN junction. The portion where the N electrode is to be provided is irradiated with a laser beam, thereby forming a heavily-doped P type alloy portion that reaches the N type LED substrate. Then the insulation film is removed, the P electrode is on the PN junction and the N electrode is formed on the heavily-doped N type alloy portion, thereby forming the P electrode and the N electrode on the same side of the LED substrate.

2 Claims, 3 Drawing Sheets

PLANAR MOUNT LED ELEMENT AND METHOD FOR MANUFACTURING THE SAME

BACKGROUND OF THE INVENTION

1. Field of the Invention

The present invention relates to an light emitting diode (LED) element used for display apparatus, indication lamp or similar applications, and particularly to an LED element that makes it possible to reduce man-hours required in the operation of mounting the LED element on a circuit board and allows high-density packaging on the circuit board.

2. Background Art

An example of a method for manufacturing an LED element 90 of the prior art is shown in FIGS. 1 and 2. First, as shown in FIG. 1, an N layer 91b of GaAsP and then an N+ layer 91c of GaAsP are formed on one side of a heavily-doped N type base layer 91a of GaP by diffusion or other proper means, thereby to obtain an LED substrate 91. Insulation films 92, 93 made of $SiO_2$ or the like are formed on the front and back sides of the LED substrate 91, respectively. Provided in the insulation film 92 on the front side are apertures 92a at portions that will be subjected to a subsequent diffusion process.

The LED substrate 91 and a P-type diffusing substance 94 (for example Zn) are put into a quartz tube 81 under vacuum condition, as shown in FIG. 2, and subjected to heat treatment at a temperature from 700 to 800° C. This causes the P-type diffusing substance 94 to be diffused over the apertures 92a, thereby forming PN junctions 95 (refer to FIG. 3).

After the process described above, the LED substrate 91 is taken out of the quartz tube 81 and undergoes such processes as removal of unnecessary portions of the insulation film 93, formation of a P electrode 96 and an N electrode 97 and cut-off. Thus the LED element 90 as shown in FIG. 3 is obtained. The LED element 90 thus obtained is mounted on a circuit board, a lead frame or the like to suit the application, fitted with wiring to the P electrode 96 using gold wire or the like and is provided with a case, thereby to make a product such as an LED display or LED lamp.

In the LED element 90 of the prior art described above, however, the P electrode 96 and the N electrode 97 are formed on different sides, the former on the front side and the latter on the back side, of the LED element 90. Consequently, wiring for the electrodes 96 and 97 must be done separately in different processes. Thus the manufacturing processes for the LED element of this configuration becomes complicated.

Particularly the P electrode 96, because of the location thereof being on the top surface of the LED element 90 when mounted, requires three-dimensional wiring that involves wires running over other components. This makes it necessary to provide a certain clearance around the LED element 90, making it impossible to mount the LED elements 90 with a high density. As a result, there occurs such a problem that display quality cannot be improved due to the packaging density when a display apparatus is formed.

SUMMARY OF THE INVENTION

An object of the present invention is to provide a method for manufacturing a planar mount LED element that makes it possible to simplify a wiring process when forming an LED display apparatus.

Another object of the present invention is to provide a method for manufacturing a planar mount LED element that makes it possible to arrange the manufactured LED elements with a high density and, as a result, to improve the display quality of an LED display apparatus.

Further another object of the present invention is to provide a planar mount LED element that can be used for achieving the objects described above.

The present invention provides a method a planar mount light emitting diode (LED) element comprising: forming a P type metal film at a predetermined portion on one surface of an N type LED substrate at a portion where a PN junction is to be formed on said surface of the N type LED substrate; forming an N type metal film at a predetermined portion on said surface of said N type LED substrate at a portion where an N electrode is to be formed on the surface of said N type LED substrate; covering said two films with an insulation film to form a capped construction; applying heat treatment at a diffusing temperature to the portion where the PN junction is to be provided, thereby to form the PN junction; irradiating a laser beam to the portion where the N electrode is to be provided, thereby to form a heavily-doped N type alloy portion that reaches said N type LED substrate; removing said insulation film; and forming the P electrode on said PN junction and forming the N electrode on said heavily-doped N type alloy portion, thereby to form the P electrode and the N electrode on the same side of the LED substrate.

While the method described above is applied to the N type LED substrate, the method may also be applied to a P type LED substrate by modifying the diffusing metal or the like.

The present invention also provides a planar mount LED element having at least a pair of P electrode and N electrode formed on the same side of the LED substrate made by the manufacturing method described above.

The manufacturing method described above makes it possible, first, to mount the P electrode and the N electrode formed on the same side of the LED element. This in turn makes it possible, when mounting the LED elements on a circuit board, to connect wirings of the P electrode and the N electrode on the board in a single process. Thus the manufacturing method simplifies the wiring process when assembling a display apparatus and achieves a remarkable effect of cost reduction.

Second, since the P electrode and the N electrode are formed on the same side of the LED element according to the manufacturing method of the present invention, the clearance that has been required in the prior art to be secured around the LED element for making wiring with gold wires can be minimized. Thus, according to the manufacturing method the density of mounting the LED elements can be increased when assembling a display apparatus having the LED elements arranged in a matrix, and achieves a remarkable effect also in improving the display quality.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

Figure 1:
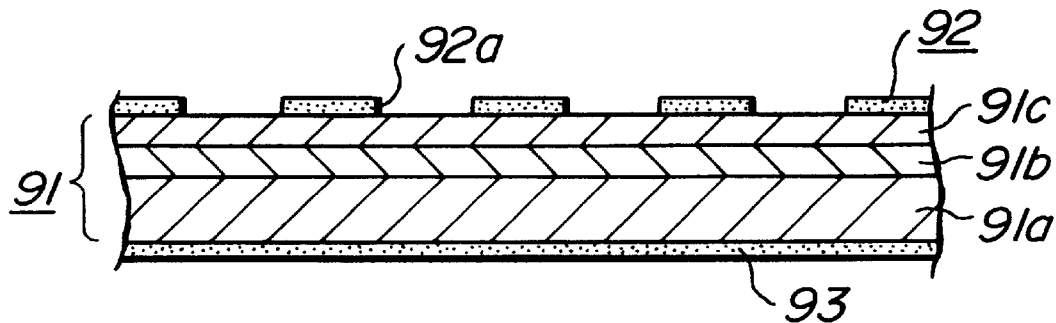
FIG. 1 is a sectional view showing first process of a prior art method of manufacturing.
Figure 2:
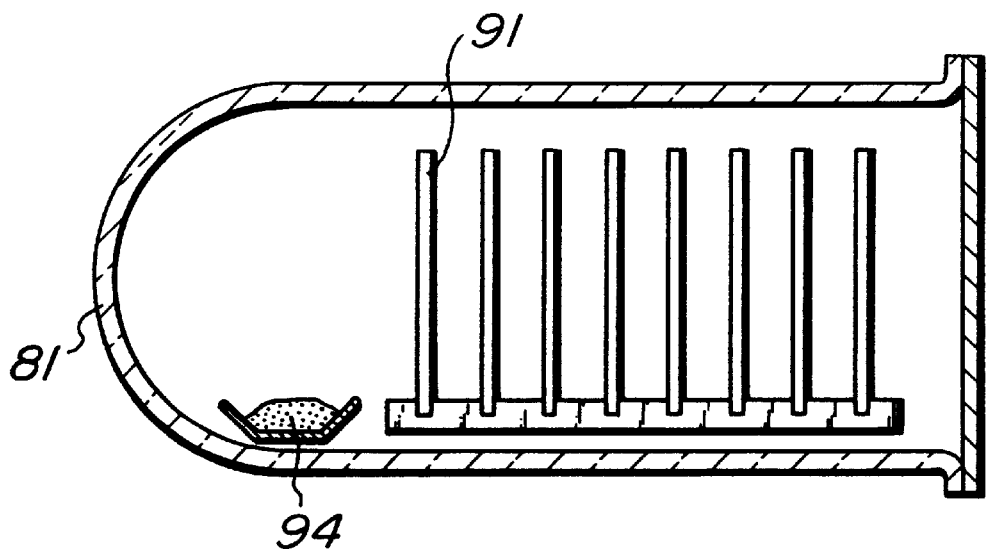
FIG. 2 is a diagram explaining second process of the prior art method of manufacturing.
Figure 3:
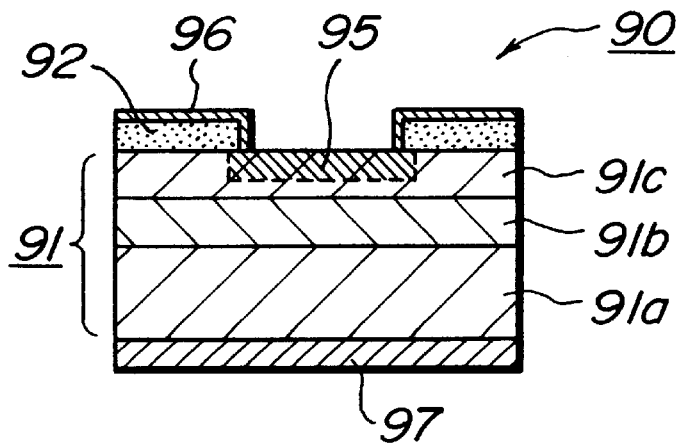
FIG. 3 is a sectional view showing an LED element of the prior art.
Figure 4:
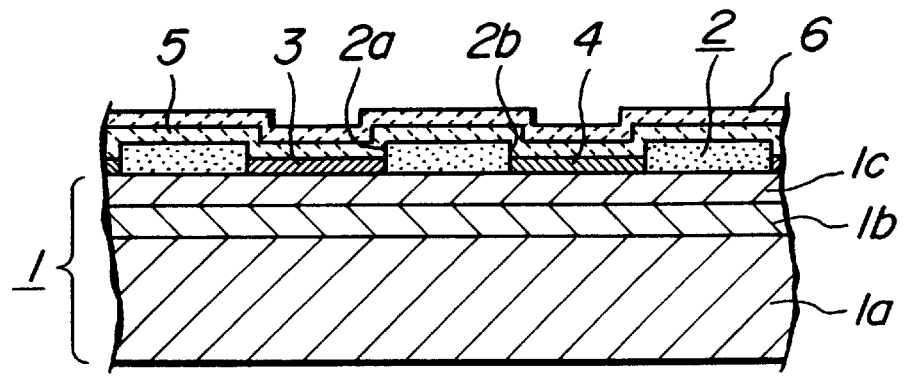
FIG. 4 is a sectional view showing first process of a method of manufacturing a planar mount LED element according to the present invention.
Figure 5:
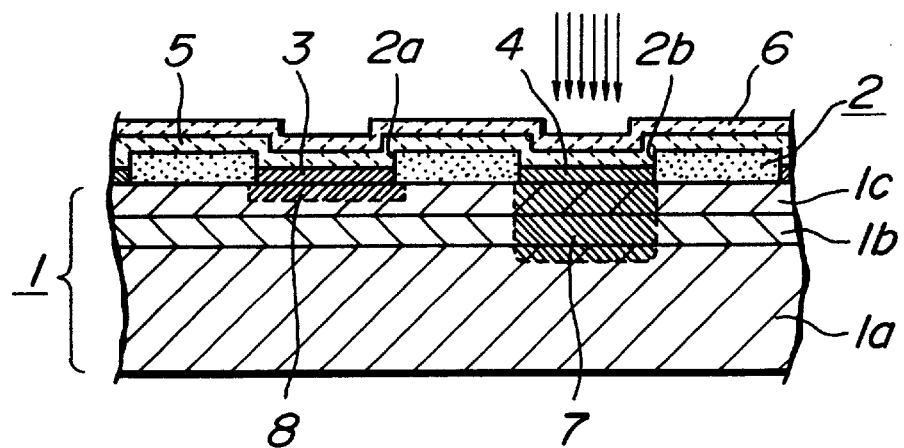
FIG. 5 is a sectional view showing second process of the method of manufacturing the planar mount LED element according to the present invention.
Figure 6:
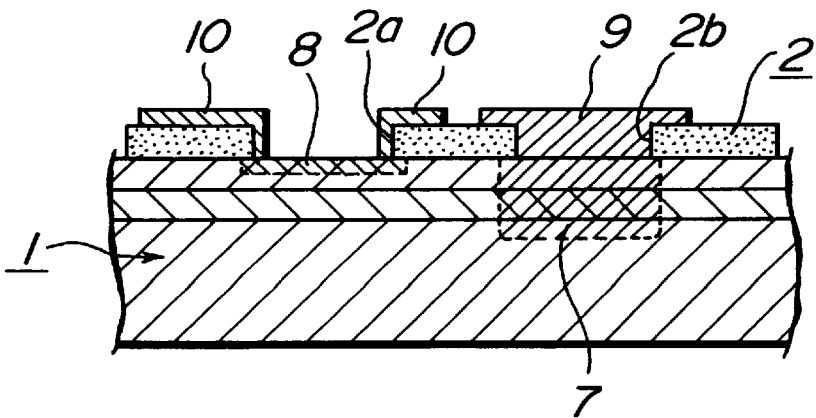
FIG. 6 is a sectional view showing third process of the method of manufacturing the planar mount LED element according to the present invention.

The present invention will now be described in detail below by way of preferred embodiments shown in the accompanying drawings. FIG. 4 through FIG. 6 show processes of the method of manufacturing the planar mount LED element according to the present invention, in the sequential order. Description of the manufacturing method according to the present invention that follows assumes that an LED substrate 1 is of N type, but the present invention is not limited thereto and the manufacturing method can be applied, in similar processes, also to a case where the LED substrate 1 is of P type due to alteration of a diffusing material, for example, as described later.

In the first process, an N layer 1b of GaAsP and an N+ layer 1c of GaAsP are formed on one side of a heavily-doped N type base layer 1a of GaP thereby to obtain an LED substrate 1, as shown in FIG. 4. Then, a first insulation film 2 made of $Si_3N_4$ is formed on the surface of the N+ layer 1c. The first insulation film 2 has diffusion apertures 2a for forming PN junctions and N electrode apertures 2b for forming N electrodes provided therein.

Then a P type metal 3 (for example Zn) is deposited in the diffusion aperture 2a by vapor deposition or sputtering. An N type metal 4 is deposited in the N electrode aperture 2b by similar measures. Then the first insulation film 2 and the apertures 2a, 2b are covered with a second insulation film 5 made of $SiO_2$, making a capped construction where the P type metal 3 and the N type metal 4 are sealed by the first and second insulation films 2 and 5. An additional third insulation film 6 made of $Si_3N_4$ may also be provided on the second insulation film 5, as required.

In the second process, as shown in FIG. 5, laser beam LB is irradiated on a portion that corresponds to the N electrode aperture 2b thereby to form a spot-shaped heavily-doped N type alloy portion 7 that reaches the base layer 1a. For the diffusion aperture 2a, the P type metal 3 is diffused in the N+ layer 1c through heat treatment at a temperature from 700 to 800° C. thereby to form a PN junction 8.

Figure 7:
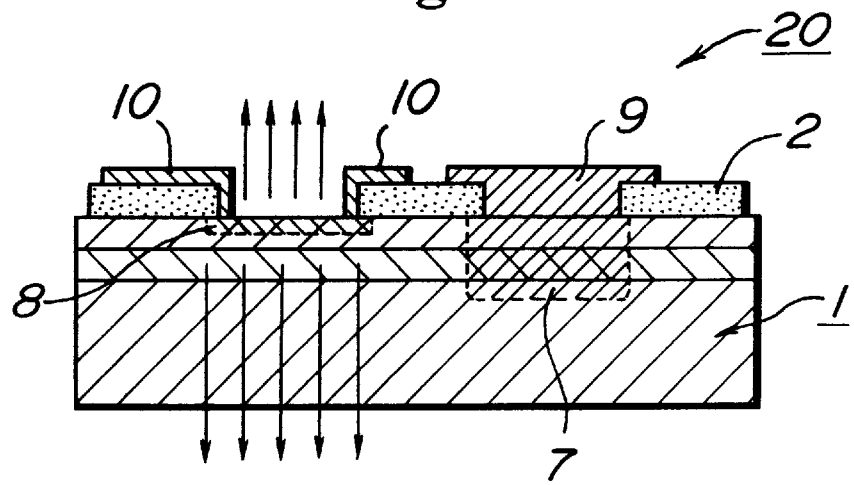
FIG. 7 is a sectional view showing one embodiment of the planar mount LED element according to the present invention.

In the third process that follows, the second insulation film 5 and the third insulation film 6, if provided, are removed as shown in FIG. 6. Thereafter, the N electrode aperture 2b namely the heavily-doped N type alloy portion 7 is provided with an N electrode 9. The diffusion aperture 2a namely the PN junction 8 is provided with a P electrode 10. Then after cut-off and other processes, the planar mount LED element 20 of the present invention shown in FIG. 7 is obtained.

Now in the description that follows, operation and effects of the planar mount LED element 20 of the present invention obtained with the manufacturing method described above will be described. With the heavily-doped N type alloy portion 7 that reaches the base layer 2a being formed as described above, the portion of the N electrode aperture 2b is provided with the base layer 1a extending to the front side of the LED substrate 1 whereon the PN junction 8 is provided.

As a result, the N electrode 9 can be provided on the same side of the LED substrate 1 as the P electrode 10 that is provided for the PN junction 8. Thus wiring for the P electrode 10 and the N electrode 9 can be done at the same time when mounting the LED element 20, provided that wirings for the P electrode and the N electrode are made in proximity to each other on the board surface.

As a consequence, it is made unnecessary to make the three-dimensional wiring with gold wire for the P electrode 10 that involves wires running over other components required in the prior art. This makes it possible to reduce the clearance around the planar mount LED element 20 required for the three-dimensional wiring. Thus the packaging density can be increased when mounting the planar mount LED element 20, for example, in a matrix configuration. As the packaging density increases, display quality of an LED display apparatus or the like is improved.

Also since the N electrode 9 and the P electrode 10 are provided on the same side of the LED substrate 1, it is made unnecessary to form an opaque film of Au or the like for making the N electrode on the back side of the LED substrate 1. Thus, this makes it possible to take out the emitted light from the PN junction 8 also through the back side (refer to FIG. 7).

Figure 8:
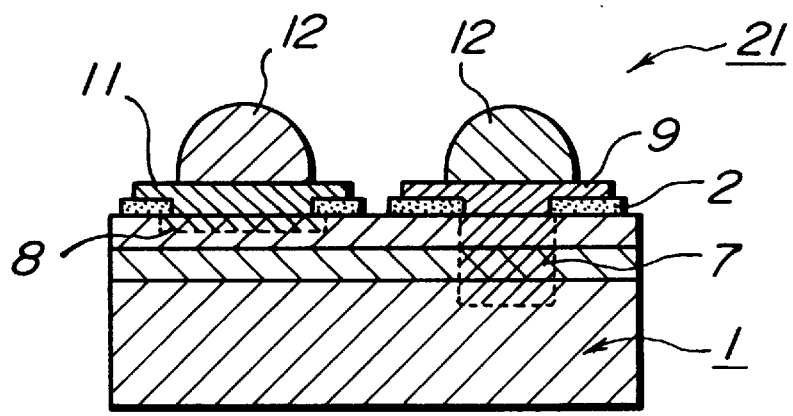
FIG. 8 is a sectional view showing another embodiment of the planar mount LED element according to the present invention.

Also such a configuration of planar mount LED element 21 as shown in FIG. 8 may also be employed where a P electrode 11 for the PN junction 8 is formed to cover the diffusion aperture 2a while bump terminals 12 as well as the N electrode 9 are attached. This configuration further improves workability when mounting the element on the board or the like. Also as interference between the light emitting surface and the mounting surface is eliminated, ease of use is improved.

Figure 9:
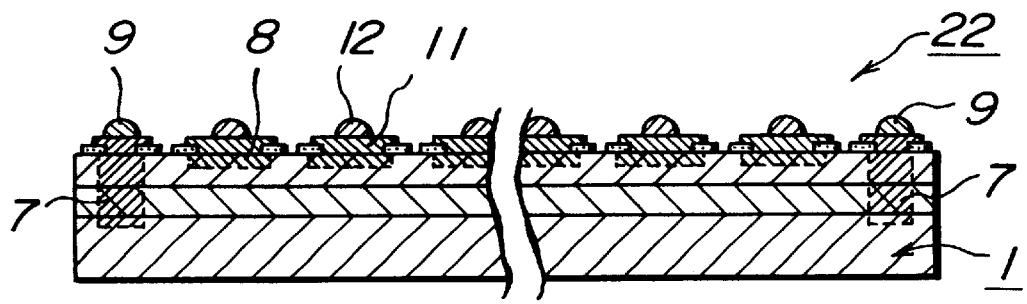
FIG. 9 is a sectional view showing further another embodiment of the planar mount LED element according to the present invention.

Further, such a configuration of planar mount LED element 22 as shown in FIG. 9 may also be employed where the heavily-doped N type alloy portion 7 and the N electrode 9 are provided at either one location or two locations at both ends on one piece of the LED substrate 1, a plurality of PN junctions 8 are formed linearly each being provided with a P electrode 11 formed thereon, thereby forming a planar mount LED element 22 of array configuration used, for example, as a writing light source of an LED printer.

While the presently preferred embodiments of the present invention have been shown and described, it will be understood that the present invention is not limited thereto, and that various changes and modifications may be made by those skilled in the art without departing from the scope of the invention as set forth in the appended claims.

What is claimed is:

1. A method for manufacturing a planar mount light emitting diode (LED) element comprising:

forming a P type metal film at a predetermined portion on one surface of an N type LED substrate at a portion where a PN junction is to be formed on said surface of the N type LED substrate;

forming an N type metal film at a predetermined portion on said surface of said N type LED substrate at a portion where an N electrode is to be formed on the surface of said N type LED substrate;

covering said two films with an insulation film to form a capped construction;

applying heat treatment at a diffusing temperature to the portion where the PN junction is to be provided, thereby to form the PN junction;

irradiating a laser beam to the portion where the N electrode is to be provided, thereby to form a heavily-doped N type alloy portion that reaches said N type LED substrate;

removing said insulation film; and forming the P electrode on said PN junction and forming the N electrode on said heavily-doped N type alloy portion, thereby to form the P electrode and the N electrode on the same side of the LED substrate.

2. A method for manufacturing a planar mount light emitting diode (LED) element comprising the steps of:

forming an N type metal film at a predetermined portion on one surface of a P type LED substrate at a portion where a PN junction is to be formed on the surface of said P type LED substrate;

forming a P type metal film at a predetermined portion on said surface of said P type LED substrate at a portion where a P electrode is to be formed on the surface of said P type LED substrate;

covering said two films with an insulation film to form a capped construction;

applying heat treatment at a diffusing temperature to the portion where the PN junction is to be provided, thereby forming the PN junction;

irradiating a laser beam to the portion where the P electrode is to be provided, thereby to form a heavily-doped P type alloy portion that reaches said P type LED substrate;

removing the insulation film; and forming the N electrode on said PN junction and forming the P electrode on said heavily-doped P type alloy portion, thereby forming the P electrode and the N electrode on the same side of the LED substrate.

* * * * *